United States Patent
Hrncirik et al.

(10) Patent No.: US 6,998,924 B1
(45) Date of Patent: Feb. 14, 2006

(54) SELF-CALIBRATION METHOD AND SYSTEM FOR SYNTHESIZERS

(75) Inventors: Dennis J. Hrncirik, Hiawatha, IA (US); Brian E. Klosterman, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 124 days.

(21) Appl. No.: 10/659,870

(22) Filed: Sep. 11, 2003

(51) Int. Cl.
*H03L 7/107* (2006.01)
(52) U.S. Cl. .......................... 331/44; 331/16
(58) Field of Classification Search ............ 331/44, 331/16, 17; 327/156, 159
See application file for complete search history.

(56) References Cited

U.S. PATENT DOCUMENTS

| | | | |
|---|---|---|---|
| 5,604,465 A * | 2/1997 | Farabaugh .................... 331/10 |
| 6,223,061 B1 * | 4/2001 | Dacus et al. ................. 455/574 |
| 2002/0075080 A1 * | 6/2002 | Nelson et al. ................ 331/11 |
| 2002/0080901 A1 * | 6/2002 | Ham, III ..................... 375/376 |
| 2004/0000956 A1 * | 1/2004 | Jaehne et al. ................. 331/16 |

* cited by examiner

*Primary Examiner*—Joseph Chang
(74) *Attorney, Agent, or Firm*—Nathan O. Jensen; Kyle Eppele

(57) ABSTRACT

A self-calibrating synthesizer phase lock loop which uses a microcontroller with an analog-to-digital converter to automatically measure, compute, select and store the appropriate gain to achieve the desired bandwidth of the phase lock loop.

13 Claims, 2 Drawing Sheets

SELF-CALIBRATION METHOD AND SYSTEM FOR SYNTHESIZERS

FIELD OF THE INVENTION

The present invention generally relates to electronics, and more particularly relates to synthesizer phase lock loop circuits, and even more particularly relates to methods and systems for self-calibration of such circuits.

BACKGROUND OF THE INVENTION

In the past, synthesizers with phase lock loops (PLLs) which operate over a wide frequency range typically must adjust loop gain in order to maintain the desired bandwidth (BW). It has been well known that PLL BW=M×Kp×Kv/N where M is the integrator gain, Kp is phase detector gain, Kv is the voltage controlled oscillator (VCO) tune sensitivity, and N is the loop division ratio.

A prior art synthesizer is shown in FIG. 1. Typically, such synthesizers require that the VCO Kv be measured across the entire frequency band. Typically, this Kv measurement requires the synthesizer to be connected to external test equipment. From the Kv measurement, the optimum M or Kp can be determined to achieve the desired BW. Typically, the M or Kp is set either from an external control device or saved in a programmable memory within the synthesizer circuit. In such circuits, expensive VCOs with very tight Kv tolerances are used to minimize variability and shorten the test measurement time. If such synthesizers need repair, it is essential that a similar VCO with the same tight tolerances be used in the repaired device. If modifications are made to the circuit, it often is necessary to recalibrate (readjust M or Kp) the circuit. This requires time and expense.

Consequently, there exists a need for improved methods and systems for calibration of a synthesizer phase lock loop and automate the calibration process.

SUMMARY OF THE INVENTION

It is an object of the present invention to provide a synthesizer phase lock loop with enhanced abilities for efficient calibration.

It is a feature of the present invention to utilize a self-calibration scheme.

It is another feature to provide a method to determine the VCO sensitivity without the use of external test equipment.

It is another feature to provide a microcontroller to determine the appropriate adjustment needed in the PLL gain to achieve a desired BW.

It is another feature to provide a microcontroller to set the PLL gain by controlling the phase detector gain, integrator value, or some other gain determining circuit to achieve the desired BW.

It is an advantage of the present invention to provide for individual self-calibration of a synthesizer PLL.

The present invention is a system and method for self-calibration of a synthesizer PLL which is designed to satisfy the aforementioned needs, provide the previously stated objects, include the above-listed features and achieve the already articulated advantages. The present invention is carried out in a manner that the need to predetermine a VCO's sensitivity across the operating range has been eliminated, or at least has been greatly reduced, which reduces the cost of test setup and eliminates the expense imposed by a requirement for VCOs with very tight tolerances.

Accordingly, the present invention is a synthesizer PLL with a microcontroller with an analog-to-digital converter to automatically measure, compute, select and store the appropriate gain to achieve the desired PLL BW.

BRIEF DESCRIPTION OF THE DRAWINGS

The invention may be more fully understood by reading the following description of the preferred embodiments of the invention, in conjunction with the appended drawings wherein.

DETAILED DESCRIPTION

Figure 1:
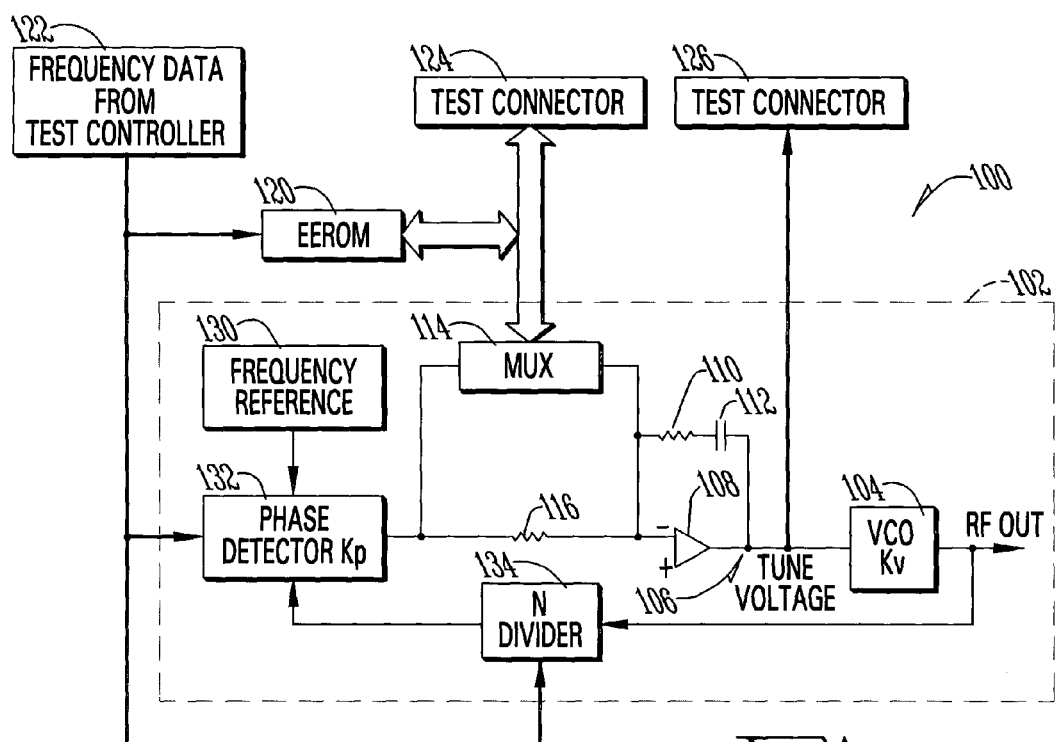
FIG. 1 is a block diagram of a prior art PLL disposed within the dotted line.

Now referring to the drawings wherein like numerals refer to like matter throughout, there is shown a synthesizer PLL and control system of the prior art, generally designated 100, which includes PLL circuit 102, having a voltage controlled oscillator (VCO) 104. VCO 104 has a tune sensitivity of Kv. PLL 102 includes an integrator 106, with an integrator op-amp 108, an integrator resistor 110, and an integrator capacitor 112. The gain of integrator 106 is represented by the variable M. The effective resistance of input resistor 116 disposed between the phase detector 132 and the integrator op-amp 108, is controlled by the MUX 114. MUX 114 is controlled by the EEROM 120 which stores in a non-volatile manner, the optimum resistance (or M) setting in a look-up table. The gain of phase detector 132 is represented by Kp and may also be varied and controlled to adjust the PLL gain. A frequency reference 130 provides a signal to phase detector 132. Divider 134 is labeled with variable N, which is the loop division ratio. Changes in N affect the RF output frequency of VCO 104.

Typically during production of a prior art PLL 102, the equation PLL BW=M×Kp×Kv/N, is used to compute the appropriate M and Kp to optimize the BW at any given frequency within the operating range of the PLL 102. For example, a frequency data signal 122 is supplied to EEROM 120 and divider 134. A test connector 124 and test connector 126 are used to monitor the tune voltage into VCO 104 and control the variable resistance at MUX 114 at various frequencies. Based upon the measurements over the entire operating range, the EEROM 120 is loaded with the appropriate data which is used during normal operation of the PLL to set the PLL BW at the various frequencies.

Figure 2:
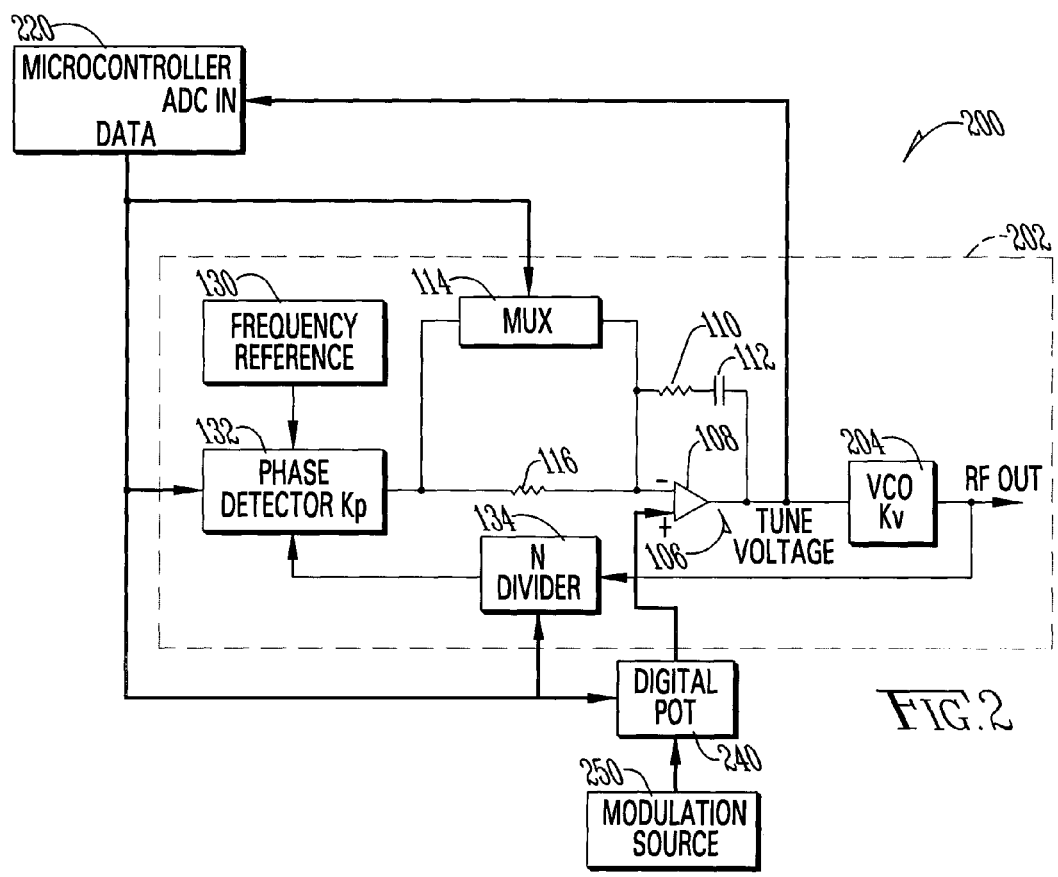
FIG. 2 is a block diagram of a PLL of the present invention disposed within the dotted line.

Now referring to FIG. 2, there is shown a PLL and control circuit system of the present invention, generally designated 200. A PLL 202, which is very similar to the prior art PLL 102, except that it includes a microcontroller 220 which provides data and control, receives feedback of the tune voltage. Microcontroller 220 can be any suitable type of microcontroller. This microcontroller may take the place of field programmable gate arrays (FPGAs), which are often used in prior art synthesizers to perform other tasks, such as convert system frequency commands to more synthesizer-friendly serial or parallel code, band selection, hop control, etc. The VCO 204 may be identical to VCO 104 except that it may be permissible to utilize less expensive VCOs with less tight tolerances, owing to the ability to self-calibrate. System 200 also includes a digital potentiometer (pot) 240 which receives a modulation signal from modulation source 250. The digital pot provides a means to control the modulation signal to integrator op-amp 108.

In operation, the system and method of the present invention could function as follows:

The PLL is implemented in a circuit or IC. The microcontroller 220 provides control signals to divider 134, digital pot 240, phase detector 132 and MUX 114; the BW is maximized by manipulation of these control signals as is determined by a feedback of the tune voltage using the above-described formula for optimized bandwidth. This self-calibration can be done at various times. Self-calibration can be limited to once at initial power-up at a factory test. It can be done on every power-up and then be saved in either volatile or non-volatile memory. For fixed or relatively slow tune synthesizer applications, the self-calibration can be done every time the frequency is changed and/or powered up.

In view of the high level of skill in the art known by designers of prior art synthesizer PLLs, it is thought that the method and apparatus of the present invention will be understood from the foregoing description, and that it will be apparent that various changes may be made in the form, construct steps and arrangement of the parts and steps thereof, without departing from the spirit and scope of the invention or sacrificing all of their material advantages. The form herein described is merely a preferred exemplary embodiment thereof.

We claim:

1. A synthesizer comprising:
a phase lock loop circuit;
a microcontroller, coupled to and configured for optimizing a bandwidth characteristic of said phase lock loop over a range of variable output frequencies;
said microcontroller further configured for carrying out a self-calibration procedure for said phase lock loop;
said self-calibration procedure involving a monitoring of a tune voltage for a voltage-controlled oscillator and manipulation of inputs into said chase lock loop circuit;
wherein said inputs include a variable loon division ratio;
an integrator within said phase lock loop circuit;
wherein said microcontroller computes an integrator gain for said integrator and a tune sensitivity characteristic for said voltage controlled oscillator;
wherein said integrator further comprises an integrator op-amp, an integrator resistor and an integrator capacitor; and
further comprising a multiplexer for providing variable resistance paths into a first input of said op-amp, where said multiplexer is controlled by said microcontroller.

2. A synthesizer of claim 1 further comprising a digital potentiometer which provides a signal to a second input to said op-amp.

3. A synthesizer of claim 2 where said microcontroller further comprises an analog-to-digital converter for converting said analog tune voltage to a digital value.

4. A synthesizer of claim 3 further comprising a modulation source configured to provide a signal to said digital potentiometer.

5. A synthesizer of claim 4 wherein said microcontroller is a field programmable gate array.

6. A synthesizer of claim 5 further comprising a phase detector having a gain of Kp, a loop division ratio of N, an integrator gain of M, a tune sensitivity characteristic of Kv, such that the bandwidth (BW) of the phase lock loop circuit is defined by BW=M×Kp×Kv/N.

7. A synthesizer of claim 1 wherein a phase detector gain is controlled by the microcontroller.

8. A synthesizer comprising:
a phase lock loop circuit;
means for optimizing a bandwidth characteristic of said phase lock loop circuit over a range of variable output frequencies, and for carrying out a self-calibration procedure for said phase lock loop;
where said self-calibration procedure involves a monitoring of a tune voltage for a voltage-controlled oscillator and manipulation of inputs into said phase lock loop circuit;
an integrator within said phase lock loop circuit;
wherein said means for optimizing further computes an integrator gain for said integrator and a tune sensitivity characteristic for said voltage controlled oscillator;
wherein said integrator further comprises an integrator op-amp, an integrator resistor and an integrator capacitor; and
further comprising a multiplexer for providing variable resistance paths into a first input of said op-amp;
where said variable resistance paths are controlled by said means for optimizing.

9. A synthesizer of claim 8 further comprising a digital potentiometer which provides a signal to a second input to said op-amp.

10. A synthesizer of claim 9 where said means for optimizing further is for converting said analog tune voltage to a digital value.

11. A synthesizer of claim 10 further comprising means for providing a modulated signal to said digital potentiometer.

12. A synthesizer of claim 8 further comprising a phase detector having a gain of Kp, a loop division ratio of N, an integrator gain of M, a tune sensitivity characteristic of Kv, such that the bandwidth (BW) of the phase lock loop circuit is defined by BW=M×Kp×Kv/N; and,
a phase detector gain is controlled by said means for optimizing.

13. A method of calibrating a synthesizer with a phase lock loop circuit comprising the steps of:
providing a variable resistance path to an input of an integrator where said variable resistance is provided by a microcontroller manipulated multiplexer;
providing a tune voltage output signal from said integrator which is input into a voltage controlled oscillator;
monitoring said tune voltage output signal by a microcontroller; and
calibrating said phase lock by manipulating a loop division ratio and said variable resistance path and calculating a gain of said integrator and a tune sensitivity characteristic of said voltage-controlled oscillator across an operating range of said voltage-controlled oscillator.

* * * * *